(12) United States Patent
Ogawa et al.

(10) Patent No.: US 10,121,686 B2
(45) Date of Patent: Nov. 6, 2018

(54) VACUUM PROCESSING APPARATUS (71) Applicant: HITACHI HIGH-TECHNOLOGIES CORPORATION, Minato-ku, Tokyo (JP)

(72) Inventors: Yoshifumi Ogawa, Tokyo (JP); Masanori Kadotani, Tokyo (JP); Masakazu Isozaki, Tokyo (JP); Nobuhide Nunomura, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 14/908,452

(22) PCT Filed: Jan. 30, 2015

(86) PCT No.: PCT/JP2015/052609
§ 371 (c)(1),
(2) Date: Jan. 28, 2016

(87) PCT Pub. No.: WO2016/121075
PCT Pub. Date: Aug. 4, 2016

(65) Prior Publication Data
US 2016/0379857 A1 Dec. 29, 2016

(51) Int. Cl.
F16K 31/124 (2006.01)
H01L 21/67 (2006.01)
(Continued)

(52) U.S. Cl.
CPC .. *H01L 21/67253* (2013.01); *C23C 16/45561* (2013.01); *F16K 51/02* (2013.01);
(Continued)

(58) Field of Classification Search
CPC .. C23C 16/45561; F15B 11/06; F15B 20/008; F16K 31/06; F16K 51/02;
(Continued)

(56) References Cited

U.S. PATENT DOCUMENTS 2,981,287 A * 4/1961 Caslow ............... F15B 13/0431
137/625.63
3,452,781 A * 7/1969 Napolitano .......... F15B 13/043
137/596.16
(Continued)

FOREIGN PATENT DOCUMENTS

JP 5-7763 A 1/1993
JP 2003-306884 A 11/2000
(Continued)

OTHER PUBLICATIONS

Office Action dated Aug. 5, 2016 for related Japanese Patent Application No. 2015-562608.

*Primary Examiner* — William McCalister
(74) *Attorney, Agent, or Firm* — Miles & Stockbridge P.C.

(57) ABSTRACT

The present invention provides a vacuum processing apparatus that includes gas supply means having a hard interlock of a pair of gas valves.

The present invention provides a vacuum processing apparatus including: a gas supply unit that supplies gas, for performing vacuum processing using normally closed type air-driven valves, to a processing chamber where the vacuum processing is performed, the gas supply unit having an interlock function in which, when a first valve of a pair of the air-driven valves is opened, a second valve of the pair is closed, the gas supply unit including an air circuit that controls air for driving the air-driven valves, the air circuit being configured using an electromagnetic valve having a solenoid coil corresponding to each of the pair of the air-driven valves.

8 Claims, 4 Drawing Sheets (51) Int. Cl.
*F16K 51/02* (2006.01)
*H01L 21/3065* (2006.01)
*C23C 16/455* (2006.01)
*F16K 31/128* (2006.01)
*F15B 20/00* (2006.01)

(52) U.S. Cl.
CPC ........ *H01L 21/3065* (2013.01); *F15B 20/008* (2013.01); *F16K 31/128* (2013.01); *F16K 31/1245* (2013.01)

(58) Field of Classification Search
CPC ............... F16K 31/1245; F16K 31/128; H01L 21/3065; H01L 21/67253; Y10T 137/86606; Y10T 137/86614; Y10T 137/86919
USPC ............................ 137/627.5, 596.15, 596.16
See application file for complete search history.

(56) References Cited

U.S. PATENT DOCUMENTS

| | | | | |
|---|---|---|---|---|
| 3,760,843 A * | 9/1973 | Larner | ................ | F15B 13/0405 137/596.15 |
| 4,638,837 A * | 1/1987 | Buike | ...................... | B62D 5/06 137/596.16 |
| 4,669,404 A * | 6/1987 | Yoneda | ................... | D05B 27/22 112/470.18 |
| 5,992,460 A * | 11/1999 | Akimoto | ............... | F15B 11/123 137/625.64 |
| 6,082,406 A * | 7/2000 | Williamson, Jr. | .. | F15B 13/0405 137/596.16 |
| 6,145,541 A * | 11/2000 | Hirota | ................... | F16K 11/044 137/596.15 |
| 6,192,937 B1 * | 2/2001 | Fagerlie | ............. | F15B 13/0402 137/625.63 |
| 6,287,980 B1 * | 9/2001 | Hanazaki | ............ | H01J 37/3244 156/345.28 |
| 2003/0212507 A1 * | 11/2003 | Wei | ....................... | C23C 16/455 702/45 |
| 2007/0163477 A1 * | 7/2007 | Nagata | ................... | D05B 27/06 112/237 |
| 2012/0255617 A1 * | 10/2012 | Miyazoe | ............... | F15B 13/0402 137/1 |
| 2015/0330519 A1 * | 11/2015 | Maurer | .................. | F16K 11/04 137/565.26 |

FOREIGN PATENT DOCUMENTS

| | | |
|---|---|---|
| JP | 2001-85342 A | 3/2001 |
| JP | 2001-319882 A | 11/2001 |

* cited by examiner

VACUUM PROCESSING APPARATUS

TECHNICAL FIELD

The present invention relates to a vacuum processing apparatus that performs processing such as etching, chemical vapor deposition (hereinafter called CVD), ashing, and surface modification for a processed object with the use of process gas.

BACKGROUND ART

For use in fabricating semiconductor devices or electric elements such as liquid crystals or solar cells, a fabrication apparatus, which performs processing for a processed material, such as a wafer, with the use of high-purity gas of various properties called process gas, is now an indispensable, important industrial machine. The control of these process gases is implemented by opening or closing the valves, which are provided in the downstream side of a mass flow controller via a flow amount controller such as the mass flow controller and are called stop valves or gas valves, according to the step information on the processing recipe.

In the actual processing, the process gas, introduced into the processing chamber or the reaction reactor (chamber), is changed to plasma or is reacted at a high temperature for performing processing such as etching, CVD, ashing, surface modification, or diffusion on a processed material. Because process gas flows into the stop valves and the gas valves, which configure the gas supply system, at a speed of several-cubic cm/minute to several linters/minute and because the valves are opened and closed according to the complex recipe step configuration, durability, reliability, and cleanliness for reducing the adherence of foreign matters onto a processed object are required.

A valve has a cylinder that applies an air pressure of about 0.3 MPa to 0.65 MPa to operate and open the valve. Usually, a normally closed type valve, which is closed when the air supply is stopped to reduce the air pressure in the cylinder, is used. A valve is closed by the pressing force of a spring. A diaphragm or a bellows is used on the contact gas part as a moving part to prevent a leakage of process gas into the external environment. A normally closed type valve, which is closed to stop the gas supply when the electric conduction of the apparatus is turned off for safety, is used in a gas supply system in many cases.

An electromagnetic valve (solenoid valve) is used to supply an air signal for causing these valves to open. The air signal is generated according to the on/off state of the electric signal. On the other hand, there are several types of process gas to be controlled: flammable gas, oxidation gas, poisonous gas, and corrosive gas. For safe use, mixture, and reaction of these gases, various interlock functions are provided on the apparatus to ensure safe processing and working.

As an example in which the interlock function is provided in a circuit that controls the air pressure for controlling valve opening/closing, there is means disclosed in Patent Literature 1.

CITATION LIST

Patent Literature

Patent Literature 1: JP-A-H05-007763

SUMMARY OF INVENTION

Technical Problem

Normally, an interlock for preventing a malfunction requires a dual mechanism of the hardware as the foolproof function. In the valve open/close operation for these process gases, the open/close operations among different valves are controlled, using an electric relay circuit according to the pressure signal and the pre-examined circuit, to create a method for preventing an abnormal reaction, gas leakage, and gas source contamination (mixture with other gases).

Of course, the control for avoiding a mistakenly or intentionally entered dangerous operation is built in the apparatus-controlling software based on the interlock concept. However, in many cases, a software interlock is insufficient as the foolproof function. Therefore, in addition to an electric interlock, another different mechanism is required. One of the methods is to stop the supply of gas immediately when an abnormality is generated or when an abnormal operation is specified.

When a gas leakage sensor, provided indoors, detects a gas, the supply to the above-described electromagnetic valve is electrically disconnected to prevent all air signals from being generated and thereby to close the valves of the process gas. At the same time, the function to disconnect the supply of air to the electromagnetic valve, which works as energy, is provided in order to eliminate valve-opening energy itself from within the pipe. This double mechanism can doubly stop the supply of process gas electrically and mechanically.

Not only an all-stop interlock upon detection of a gas leakage as described above but also an interlock for use while actual process gas is used is necessary. Usually, when the vacuum gauge detects a pressure lower than a predetermined pressure (for example, 500 Pa) on the side of the processing chamber or the reaction reactor (chamber) in the downstream side of the gas flow, an apparatus is configured so that no problem is generated even if a mixture of flammable gas and oxidation gas flows and a rapid reaction occurs.

For this apparatus, this vacuum gauge signal is used as an electric interlock for the flammable gas valve open state and the oxidation gas valve open state. In addition, in an apparatus in which corrosive gas is used (for example, etching apparatus), the last-stage valve is provided near the processing chamber or the reaction reactor (chamber) to minimize the number of process gas pipes exposed to the air during maintenance and to reduce the generation of foreign matters such as rust.

In addition to the above-described signal that the valve won't be opened (unable to let gas flow) only when it is in the vacuum state, it is necessary to allow the exit valve of flammable gas and oxidation gas to be opened only when this last-stage valve is open. Otherwise, high supply-pressure gas flows to low-pressure gas via the pipe with the result that a high-pressure mixture of flammable gas and oxidation gas is produced, resulting in a very dangerous state.

For use when a mass flow controller or these gas valves are replaced at a maintenance time, an N2 purge line from the low-reactivity nitrogen gas source is provided in the upstream side of the mass flow controller in order to fill the pipe with safe gas for removing poisonous or corrosive gas. Usually, a check valve is provided to prevent process gas from being flown backward into the N2 purge line pipe, and the N2 purge pressure is set higher than the process gas pressure to prevent a backward flow.

Not only that, an interlock is necessary to prevent the valve, which supplies this purge N2 gas, and the supply source valve of the process gas from being opened at the same time. Usually, a high-reliability valve is used that minimizes the probability with which these two valves fail at the same time. Therefore, in addition to an electric interlock that opens the valve only in the vacuum state, an interlock that prevents these two valves from being opened at the same time must be provided separately as the fool-proof function.

In addition, in the gas supply system, some apparatuses have a normal gas line, through which the gas flows via the last-stage valve so that the gas contacts a processed object in the processing chamber or the reaction reactor (chamber) for processing it, and a line which is provided to dispose of the gas into the downstream side for exhausting it. In this case, the gas pipe is connected before and after the compression-type turbo molecular pump and, for example, when the valve in the last-stage and the valve of the pipe for gas disposal are opened at the same time, the compressed gas in the downstream of the turbo molecular pump flows backward from the last-stage valve to the processing chamber or the reaction reactor (chamber) via the gas pipe. Although there is no safety problem in some cases, the contaminated atmosphere or components or foreign matters in the downstream are supplied to the processing chamber or the reaction reactor (chamber) with the result that the processing cannot be performed.

In view of the above problems, the present invention provides a vacuum processing apparatus that has gas supply means having a hard interlock for a pair of gas valves.

Solution to Problem

The present invention provides a vacuum processing apparatus including: a gas supply unit that supplies gas, for performing vacuum processing using normally closed type air-driven valves, to a processing chamber where the vacuum processing is performed, the gas supply unit having an interlock function in which, when a first valve of a pair of the air-driven valves is opened, a second valve of the pair is closed, the gas supply unit including an air circuit that controls air for driving the air-driven valves, the air circuit being configured using an electromagnetic valve having a solenoid coil corresponding to each of the pair of the air-driven valves.

In addition, the present invention provides a vacuum processing apparatus including: a gas supply unit that supplies gas, for performing vacuum processing using normally closed type air-driven valves, to a processing chamber where the vacuum processing is performed, the gas supply unit including an air circuit that controls air for driving the air-driven valves, the air circuit including a logic air circuit unit that configures a logic circuit OR or AND that establishes open/close conditions for the air-driven valves.

Advantageous Effects of Invention

According to the present invention, a hard interlock for a pair of gas valves can be configured.

DESCRIPTION OF EMBODIMENTS

Respective embodiments of the present invention are described below with reference to FIG. 1 to FIG. 4.

Figure 1:
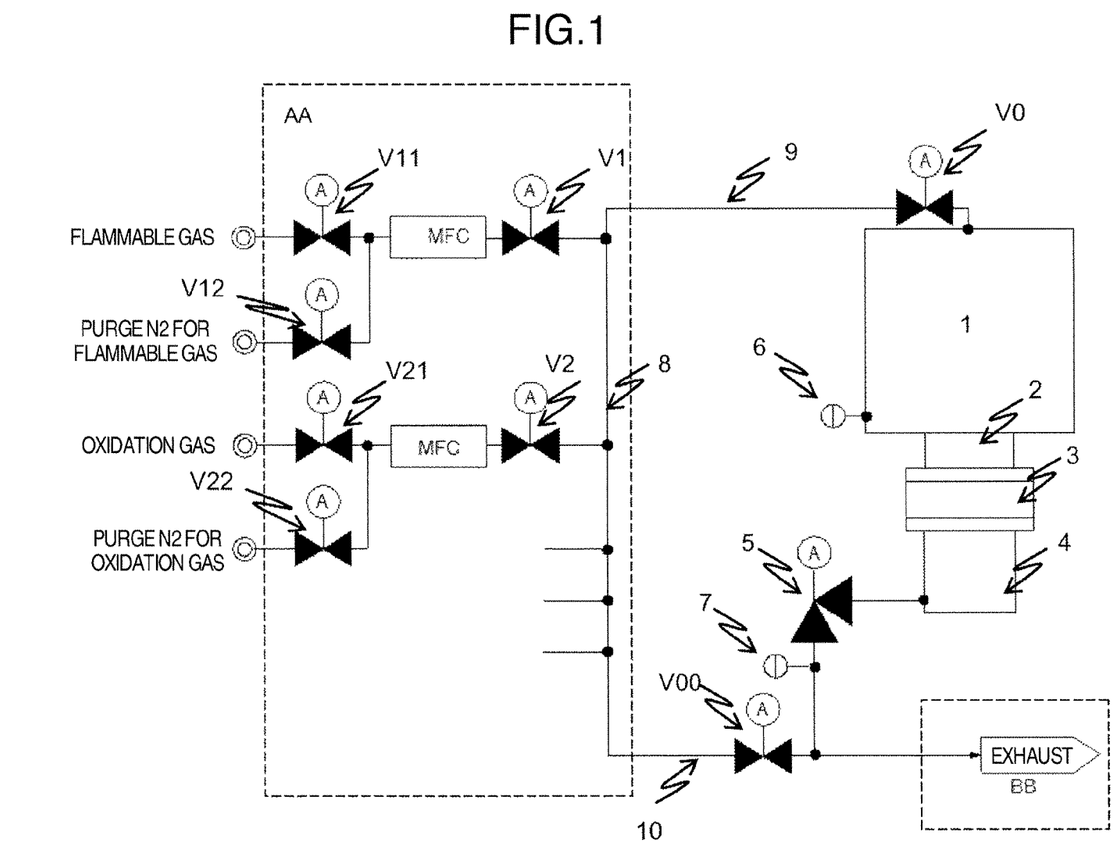
FIG. 1 is a schematic configuration diagram of a vacuum processing apparatus, which uses process gas, according to the present invention.

A vacuum processing apparatus, which uses process gas, according to the present invention is described. FIG. 1 is a schematic configuration diagram of the vacuum processing apparatus, which uses process gas, according to the present invention. The range surrounded by AA indicates a gas supply system (mass flow controller unit: hereinafter called an MFC). Process gases, a pressure detection unit, and a gas regulator for adjusting the supply pressure, not shown in the figure, may also be configured inside the range. The range surrounded by BB indicates a gas exhaust system the downstream of which includes a dry pump, an exhaust gas processing apparatus (not shown), and the like.

A processed object such as a wafer (not shown) is mounted inside a processing chamber 1. A main valve 2 is provided to protect the exhaust system from exposure to oxygen and moisture in the atmosphere when the processing chamber 1 is exposed to the atmosphere at a maintenance time. A pressure adjustment valve 3 is provided to give a desired pressure to the processing chamber 1 by changing its internal conductance. A turbo molecular pump 4 is arranged for compressing the process gas, supplied to the processing chamber 1, at a high-pressure rate for exhausting it. In the downstream of the turbo molecular pump 4, an angle valve 5 is used for maintaining the turbo molecular pump 4 in the vacuum state when the exhaust system is stopped.

A pressure gauge 6 is a pressure gauge for the processing chamber, and a pressure gauge 7 is a pressure gauge for an exhaust line. The process gas in the gas supply system AA has its flow amount controlled by its respective MFC during usage and is mixed in a manifold 8 of the process gas. In one case, this mixed gas is sent via a gas supply pipe 9 and is introduced into the processing chamber 1 via a last-stage valve V0. In another case, this mixed gas is sent via a gas exhaust pipe 10 of the exhaust system and is disposed of to the exhaust system BB via a disposable gas valve V00.

A valve V1 is a valve at the exit (downstream) of the MFC for flammable gas, and a valve V2 is a valve at the exit (downstream) of the MFC for oxidation gas. A valve V11 is a valve for the process gas supply (upstream) of flammable gas, and a valve V21 is a valve for the process gas supply (upstream) of oxidation gas. In the upstream of the MFCs, an N2-purge valve V12 for supplying purge N2 for flammable gas and an N2-purge valve V22 for supplying purge N2 for oxidation gas, as well as V11 and V12 that are the process gas supply (upstream) valves, are connected with pipes.

As a combination of process gas valves that cannot be opened at the same time in this vacuum processing apparatus, first, there is a combination of the last-stage valve V0 and the disposable gas valve V00. If these two valves are opened at the same time, the higher-pressure gas in the downstream of the angle valve 5 (compressed by the turbo molecular pump 4) flows backward into the processing chamber 1. Next, there are a combination of the valve V11, which is the process gas supply (upstream) valve of flammable gas, and the N2-purge valve V12 and a combination of the valve V21, which is the process gas supply (upstream) valve of oxidation gas, and the N2-purge valve V22.

In addition, to prevent the gas from becoming turbid as it flows into the downstream side, it is required that the valve V11 and the valve V21, which are the process gas supply (upstream) valves, not be opened unless one of the last-stage valve V0 and the disposable gas valve V00 is opened.

Figure 2:
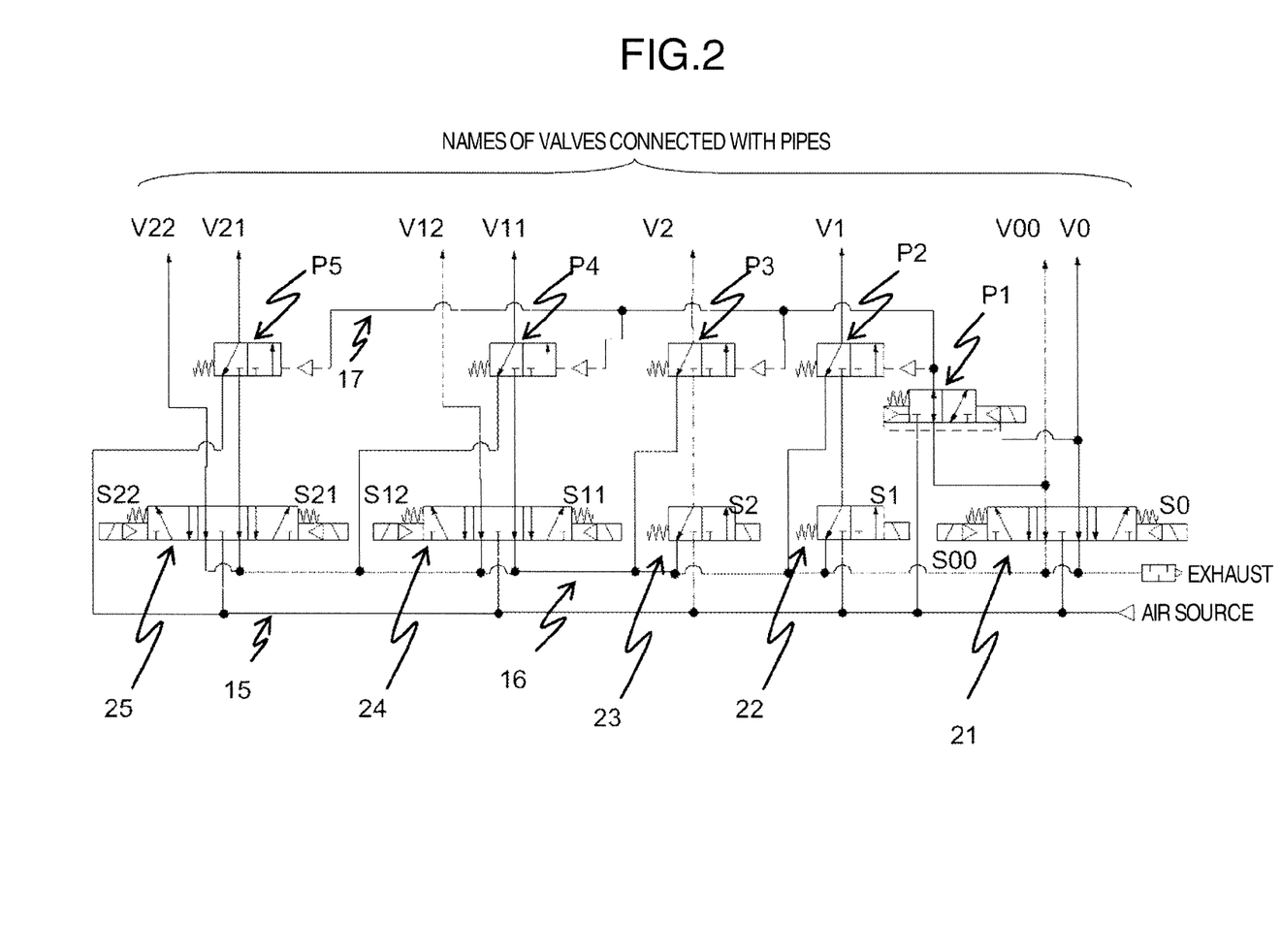
FIG. 2 is a diagram showing the control system of air signals according to the present invention.

FIG. 2 is a diagram showing the control system of air signals in the vacuum processing apparatus shown in FIG. 1. To an air supply line 15, pressurized air is supplied from the air source. An air exhaust line 16 is a line via which the air, remaining in the cylinder after the valve being driven, is exhausted. Solenoid coil excitation elements S0-S22 are solenoid coil excitation elements each of which generates air for driving the respective process gas valve open.

In the system control system, each solenoid coil (denoted by the same number) is excited according to a respective gas valve open command and pressure is applied by the air signal (air supply) to open the valve. When the solenoid coil is not excited, air is not supplied to three-position spring return center exhaust type five-port electromagnetic valves 21, 24, and 25 and air is removed from them via the air exhaust line 16.

Two-position spring return type electromagnetic valves 22 and 23 generate air for driving the valve V1 out, which is a flammable gas MFC exit (downstream) valve, and the valve V2, which is a oxidation gas MFC exit (downstream) valve, according to an open command that excites solenoid coil excitation elements S1 and S2. A pilot valve P1, which is a pilot valve for forming an air signal, forms a pilot air signal line 17. Pilot valves P2 to P5, which are driven by the pilot air signal line 17, are pilot valves.

Because the solenoid coil excitation elements S0 and S00 are arranged at both ends of the three-position spring return center exhaust type five-port electromagnetic valves 21, the air signal is generated always on the excited side to prevent both the last-stage valve V0 and the disposable gas valve V00 from being opened at the same time. Similarly, the three-position spring return center exhaust type five-port electromagnetic valves 24 prevents both the valve V11 and the N2-purge valve V12 from being opened at the same time, and the three-position spring return center exhaust type five-port electromagnetic valves 25 prevents both the valve V21 and the N2-purge valve V22 from being opened at the same time.

In FIG. 2, when the solenoid coil excitation element S00 is excited, the disposable gas valve V00 is opened and, at the same time, the pilot air signal line 17 is formed through the pilot valve P1 that is a pilot valve for forming an air signal. Therefore, the pilot valves P2 to P5 are driven to allow the air to pass through the pilot valves. If the solenoid coil excitation elements S1, S2, S11, and S21 are excited at this time, the corresponding valves, V1, V2, V11, and V21, are opened. Next, when the solenoid coil excitation element S00 is turned off, the disposable gas valve V00 is closed and the air in the pilot air signal line 17 is removed Therefore, even if the solenoid coil excitation elements S1, S2, S11, and S21 are excited and the air is supplied, the air is blocked by the pilot valves P2 to P5 and the valves V1, V2, V11, and V21 are closed.

In addition, when the solenoid coil excitation element S0 is excited, the last-stage valve V0 is opened. At the same time, the pilot valve P1, which is a pilot valve for forming the air signal, is driven to generate the air signal in the pilot air signal line 17, and the pilot valves P2 to P5 are driven to allow the air to pass through the pilot valves. Because the behavior of the valves when the solenoid coil excitation element S0 is turned off is the same as the behavior of the valves when the solenoid coil excitation element S00 is turned off the description is omitted. As described above, the air circuit is formed in which the valves V1, V2, V11 and V21 can be opened only when one of the last-stage valve V0 and the disposable gas valve V00 is opened.

For the N2-purge valves V12 and V22 that are nitrogen purge lines, the N2 purge must be performed at a replacement or maintenance time of the apparatuses, such as the valves and mass flow controllers, in the gas supply system AA. Therefore, because those valves must be opened even when neither the last-stage valve V0 nor the disposable gas valve V00 is opened to allow the N2 purge to be performed, the N2-purge valves V12 and V22 are able to be opened directly, not via the pilot valves with the use of the pilot air signal line 17, while solenoid coil excitation elements S12 and S22 are ON.

The object of the present invention is achieved by an interlock, in which the valves must not be opened at the same time, and an interlock, in which valves cannot be opened unless one of the other valves is opened, that can be formed by this air circuit as described above.

Although an example of control using an OR logic circuit, which requires that one of the valves be open, is shown in this embodiment, an air circuit composed of an AND logic circuit is, of course, formed in a configuration in which a plurality of valves is arranged in series in the downstream side.

Figure 3A:
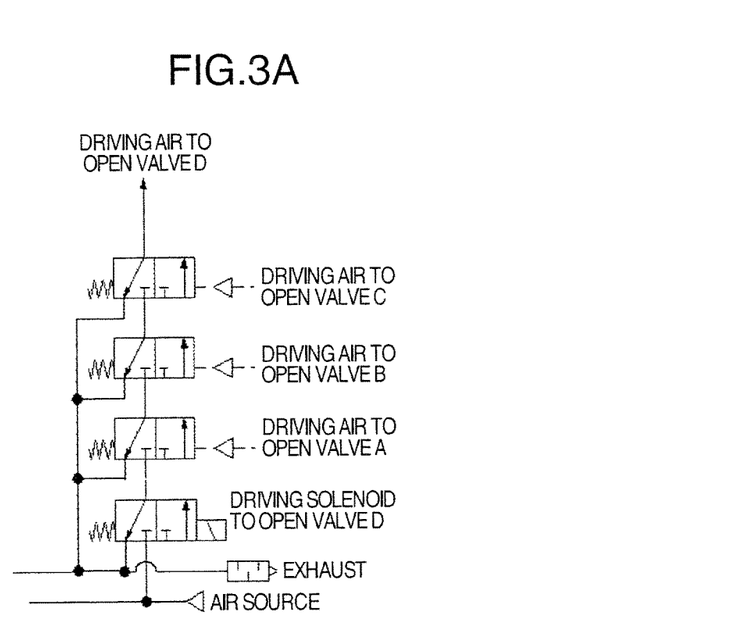
FIG. 3A is a diagram showing the control system of air signals that configure a logic circuit.
Figure 3B:
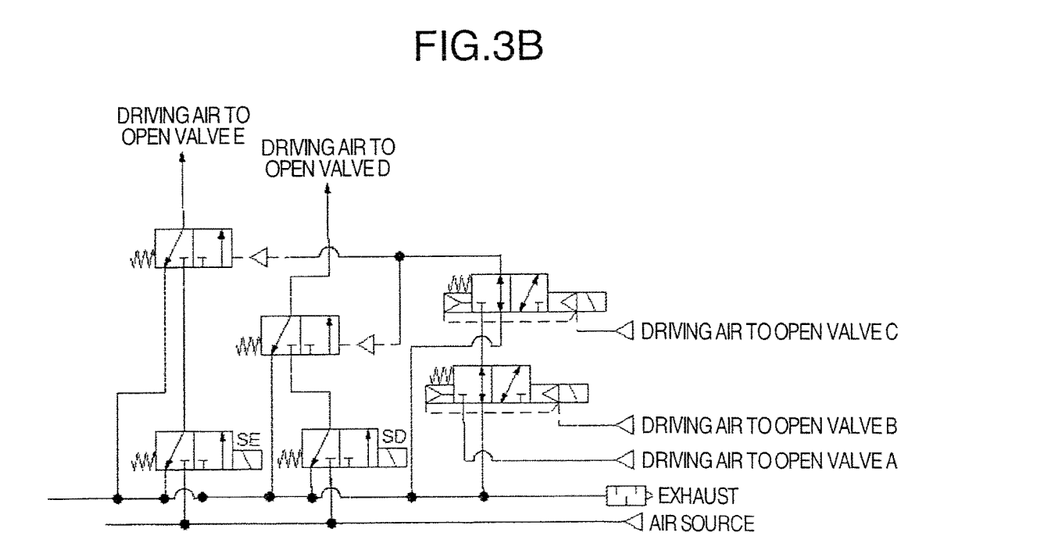
FIG. 3F is a diagram showing the control system of air signals that configure a logic circuit.

For example, the valve D shown in FIG. 3A is a valve that must not be opened unless all valves, the valve A, the valve B, and the valve C, arranged in series in the downstream side are in the open state. That is, the interlock function of an AND logic circuit can be implemented by the air circuit in FIG. 3A that shows an example of single-valve driving control. In addition, FIG. 3B shows an example of dual-valve driving control that indicates the case of valves in which both the valve D and the valve E must not be opened unless all of the valve A, the valve B, and the valve C described above are opened. The means shown in FIG. 3B, which forms the control pilot signal (air pressure), has a merit in that the total number of pilot valves and the control elements can be reduced. In this way, the air circuit may be formed using an AND logic circuit.

Figure 4:
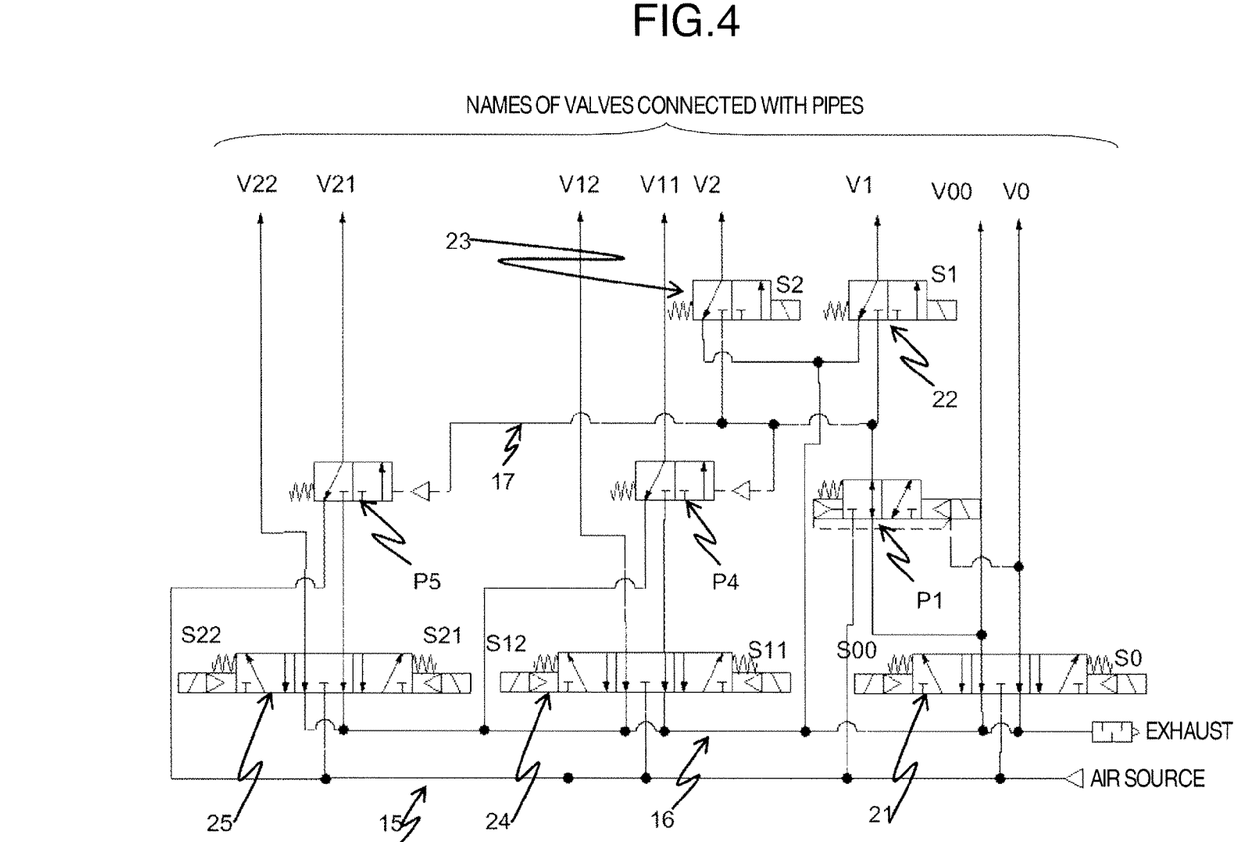
FIG. 4 is a diagram showing the control system of air signals according to the present invention.

Another embodiment is described with reference to FIG. 4. The configuration differs from the configuration in FIG. 2 in that the air pressure of the pilot air signal line 17 is used directly as the driving air for opening the valves V1 and V2. If the solenoid coil excitation element S1 and the solenoid 82 are turned on when the air pressure is supplied to the pilot air signal line 17, that is, when one of the last-stage valve V0 and the disposable gas valve V00 is opened, each of the valves V1 and v2 can be opened. In addition, the configuration shown in FIG. 4 has a merit that the three-position spring return center exhaust type five-port electromagnetic valves 21, 24, and 25 can be well arranged in space in the manifold type.

The present invention, with the configuration described above, can achieve the following effects.

First, for a pair of valves both of which cannot be opened at the same time, the supply of air to the pair of valves, which cannot be opened at the same time, is assigned to the excitation of the left and right solenoids of the same electromagnetic valve in order to physically prevent the pair of valves from being opened at the same time.

In the present invention, for a valve that can be opened only when a valve in the downstream side is opened, air is supplied via the pilot valve that uses the air signal itself which opens the valve in the downstream side, as the pilot signal; therefore, when the valve in the downstream side is closed first, the supply valve in the upstream side is also closed automatically and, thus, a continued mixture of process gases in the pipe can be prevented.

In addition, the present invention may implement a dual interlock by applying these mechanical interlocks and a relay circuit which won't be activated electrically unless it is in vacuum to solenoid excitation. In addition, the present invention allows a software interlock to be combined with those hardware interlocks.

As described above, the present invention can provide a dual interlock, formed by an electric interlock and a mechanical air-signal interlock, thus providing the foolproof function. This ensures the reliability and safety of the vacuum processing apparatus.

REFERENCE SIGNS LIST 1 processing chamber
2 main valve
3 pressure adjustment valve
4 turbo molecular pump
5 angle valve
6 pressure gauge
7 pressure gauge
8 manifold
9 gas supply pipe
10 gas exhaust pipe
V0 last-stage valve
V00 disposable gas valve
V1, V2, V11, V21 valve
V12, V22 N2-purge valve
15 air supply line
16 air exhaust line
17 pilot air signal line
21, 24, 25 three-position spring return center exhaust type five-port electromagnetic valve
22, 23 two-position spring return type electromagnetic valve
S0, S00, S1, S2, S11, S12, S21, S22 solenoid coil excitation element
P1, P2, P3, P45, P5 pilot valve

The invention claimed is:

1. A vacuum processing apparatus comprising:
a plurality of pairs of normally closed air-driven valves; and
a gas supply unit that supplies gas, for performing vacuum processing using the plurality of normally closed type air-driven valves, to a processing chamber where the vacuum processing is performed,
the gas supply unit comprising
an air circuit that controls air to drive the plurality of air-driven valves, the air circuit comprising
a plurality of three-position spring return center exhaust type five-port electromagnetic valves each having a solenoid coil and each coupled to one of a corresponding pair of the plurality of air-driven valves, each said three-position spring return center exhaust type five-port electromagnetic valve being configured to generate air to drive open one of said plurality of air-driven valves,
wherein said plurality of pairs of normally closed air-driven valves comprises a first pair of normally closed air-driven valves consisting of a last stage valve and a disposable gas valve, and at least a second and third pair of normally closed air-driven valves, each of said second and third pairs of normally closed air-driven valves comprising a respective supply valve and a respective purge valve,
wherein the air circuit is configured such that when a first air-driven valve of said first pair of the plurality of pairs of normally-closed air-driven valves is opened, a second air-driven valve of said first pair of normally-closed air-driven valves is maintained closed, and
wherein the air circuit is further configured to prevent any air-driven valve of said second and third pairs of normally closed air-driven valves from opening unless one of said last stage valve and said disposable gas valve of said first pair of normally closed air-driven valves opens.

2. The vacuum processing apparatus according to claim 1, wherein the supply valve of the second pair of the plurality of air-driven valves is coupled to a flammable gas of said gas supply unit to control a supply of said flammable gas and the supply valve of the third pair of the plurality of air-driven valves is coupled to an oxidation gas of said gas supply unit to control a supply of said oxidation gas.

3. The vacuum processing apparatus according to claim 1 wherein the gas supply unit further comprises an interlock function implemented by an electric circuit.

4. The vacuum processing apparatus according to claim 1, wherein said gas supply unit is configured such that when a first air-driven valve of any of the first, second, or third pairs of the plurality of air-driven valves is opened, the second air-driven valve of the same pair is closed so as to prevent both the first and second air-driven valves of each of the first, second, and third pairs of valves from being open at the same time.

5. The vacuum processing apparatus according to claim 1, wherein the air circuit further comprises a plurality of a second type of electromagnetic valve which is a two-position spring return type electromagnetic valve.

6. A vacuum processing apparatus comprising:
a plurality of normally closed type air-driven valves; and
a gas supply unit that supplies gas, using the plurality of normally closed type air-driven valves, to a vacuum processing chamber,
wherein the gas supply unit comprises
an air circuit that controls air which drives the plurality of normally closed type air-driven valves such that when a first air-driven valve of a pair of the normally closed type air-driven valves is opened, a second air-driven valve of the same pair is maintained closed, the air circuit comprising
a three-position spring return center exhaust type five-port electromagnetic valve having two solenoid coils,
wherein each of two solenoid coils corresponds to each of the pair of the normally closed type air-driven valves, and
wherein the three-position spring return center exhaust type five-port electromagnetic valve is configured to generate said air which opens one of the pair of the normally closed type air-driven valves corresponding to the excited solenoid coil.

7. The vacuum processing apparatus according to claim 6, wherein the air circuit further comprises a plurality of a second type of electromagnetic valve which is a two-position spring return type electromagnetic valve, and a pilot valve, and
wherein each of the second type of electromagnetic valves supplies air, via the pilot valve, to each of the normally closed type air-driven valves corresponding to each of the second type of electromagnetic valves.

8. The vacuum processing apparatus according to claim 7, wherein the three-position spring return center exhaust type five-port electromagnetic valve comprises a plurality of the three-position spring return center exhaust type five-port electromagnetic valves, and
wherein one of the plurality of the three-position spring return center exhaust type five-port electromagnetic valves generates air which drives the pilot valve.

* * * * *